(12) United States Patent
Loke et al.

(10) Patent No.: US 10,009,036 B2
(45) Date of Patent: Jun. 26, 2018

(54) SYSTEM AND METHOD OF CALIBRATING INPUT SIGNAL TO SUCCESSIVE APPROXIMATION REGISTER (SAR) ANALOG-TO-DIGITAL CONVERTER (ADC) IN ADC-ASSISTED TIME-TO-DIGITAL CONVERTER (TDC)

(71) Applicant: Samsung Electronics Co., Ltd., Gyeonggi-do (KR)

(72) Inventors: Wing-Fai Loke, San Jose, CA (US); Chih-Wei Yao, Sunnyvale, CA (US)

(73) Assignee: Samsung Electronics Co., Ltd (KR)

( * ) Notice: Subject to any disclaimer, the term of this patent is extended or adjusted under 35 U.S.C. 154(b) by 0 days. days.

(21) Appl. No.: 15/430,163

(22) Filed: Feb. 10, 2017

(65) Prior Publication Data

US 2018/0076821 A1    Mar. 15, 2018

Related U.S. Application Data

(60) Provisional application No. 62/385,318, filed on Sep. 9, 2016.

(51) Int. Cl.
| | | |
|---|---|---|
| H03L 7/06 | (2006.01) | |
| H03M 1/10 | (2006.01) | |
| H03M 1/38 | (2006.01) | |
| G04F 10/00 | (2006.01) | |
| H03M 1/12 | (2006.01) | |
| H03L 7/099 | (2006.01) | |
| H03L 7/087 | (2006.01) | |
| G06F 17/50 | (2006.01) | |

(52) U.S. Cl.
CPC ........ *H03M 1/1009* (2013.01); *G04F 10/005* (2013.01); *G06F 17/5081* (2013.01); *H03L 7/087* (2013.01); *H03L 7/0995* (2013.01); *H03M 1/1245* (2013.01); *H03M 1/38* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,526,374 B1 * | 2/2003 | Martin | .................. H03L 7/0996 327/156 |
| 7,332,973 B2 * | 2/2008 | Lee | ....................... G04F 10/005 327/12 |
| 7,474,974 B2 | 1/2009 | Roberts et al. | |
| 7,528,760 B2 | 5/2009 | Forejt | |

(Continued)

OTHER PUBLICATIONS

Chun-Cheng Liu, et al. A 10-bit 50-MS/s SAR ADC With a Monotonic Capacitor Switching Procedure, IEEE Journal of Solid-State Circuits, vol. 45, No. 4, Apr. 2010.

(Continued)

*Primary Examiner* — Adam Houston
(74) *Attorney, Agent, or Firm* — The Farrell Law Firm, P.C.

(57) ABSTRACT

An apparatus and a method. The apparatus includes a counter array; a ring oscillator that is electrically coupled to the counter array, where the counter array counts a number of cycles in the ring oscillator; an analog-to-digital converter (ADC) driver that is electrically coupled to the ring oscillator; and an ADC that is electrically coupled to the ADC driver, where an output of the ADC is electrically coupled to the ring oscillator.

20 Claims, 7 Drawing Sheets

(56) References Cited

U.S. PATENT DOCUMENTS

| | | | |
|---|---|---|---|
| 7,750,305 B2 * | 7/2010 | Solf | G01T 1/2985 250/363.04 |
| 7,886,176 B1 * | 2/2011 | Svoiski | G06F 1/10 327/158 |
| 7,928,361 B1 | 4/2011 | Whitehouse et al. | |
| 8,451,159 B1 | 5/2013 | Gupta et al. | |
| 8,721,174 B2 | 5/2014 | Chen | |
| 8,786,474 B1 | 7/2014 | Mann | |
| 8,952,838 B2 | 2/2015 | Waters et al. | |
| 9,762,250 B2 * | 9/2017 | Perrott | H03L 7/0802 |
| 2004/0246007 A1 * | 12/2004 | Fallot-Burghardt | G01D 5/2013 324/667 |
| 2007/0194824 A1 * | 8/2007 | Kumata | G11C 7/1066 327/158 |
| 2008/0191921 A1 * | 8/2008 | Scholz | G04F 10/005 341/166 |
| 2010/0026352 A1 * | 2/2010 | Jacobowitz | H03L 7/0996 327/158 |
| 2011/0133799 A1 * | 6/2011 | Dunworth | H03L 7/089 327/157 |
| 2013/0222023 A1 * | 8/2013 | Lin | H03L 7/099 327/156 |
| 2015/0145567 A1 * | 5/2015 | Perrott | H03L 7/093 327/156 |
| 2015/0222469 A1 * | 8/2015 | Onishi | H04B 1/10 375/376 |
| 2015/0370223 A1 * | 12/2015 | Mann | G04F 10/005 250/336.1 |
| 2016/0238998 A1 | 8/2016 | Pavlovic et al. | |
| 2016/0241301 A1 | 8/2016 | Pavlovic et al. | |
| 2016/0242645 A1 * | 8/2016 | Muller | A61B 5/7203 |
| 2017/0214408 A1 * | 7/2017 | Liang | H03L 7/093 |
| 2017/0244544 A1 * | 8/2017 | Galton | H03L 7/093 |

OTHER PUBLICATIONS

Chih-Wei Yao, et al. A 2.8-3.2-GHz Fractional-N Digital PLL With ADC-Assisted TDC and Inductively Coupled Fine-Tuning DCO, IEEE Journal of Solid-State Circuits, vol. 48, No. 3, Mar. 2013.

Zule Xu, et al., A 3.6 GHz Low-Noise Fractional-N Digital PLL Using SAR-ADC-Based TDC, IEEE Journal of Solid-State Circuits, vol. 51, No. 10, Oct. 2016.

Yan-Jiun Chen, et al. A 2.02-5.16 fJ/Conversioin Step 10 Bit Hybrid Coarse-Fine SAR ADC With Time-Domain Quantizer in 90 nm CMOS, IEEE Journal of Solid-State Circuits, vol. 51, No. 2, Feb. 2016.

\* cited by examiner

SYSTEM AND METHOD OF CALIBRATING INPUT SIGNAL TO SUCCESSIVE APPROXIMATION REGISTER (SAR) ANALOG-TO-DIGITAL CONVERTER (ADC) IN ADC-ASSISTED TIME-TO-DIGITAL CONVERTER (TDC)

PRIORITY

This application claims priority under 35 U.S.C. § 119(e) to a U.S. Provisional patent application filed on Sep. 9, 2016 in the United States Patent and Trademark Office and assigned Ser. No. 62/385,318, the entire contents of which are incorporated herein by reference.

FIELD

The present disclosure relates generally to electronic circuits, and more particularly, to a system and method of calibrating an input signal to successive approximation register (SAR) analog-to-digital converter (ADC) in an ADC-assisted time-to-digital converter (TDC).

BACKGROUND

A TDC is a device that provides a digital representation of a time duration at which an event occurs. A TDC determines an interval of time between two signal pulses (e.g., a start pulse and a stop pulse).

A typical all-digital phase-locked loop (ADPLL) includes a TDC, a digital loop filter, a digitally-controlled oscillator (DCO), and a divider. The TDC may introduce quantization noise to the ADPLL. As a result, a high-resolution TDC is desired for a low-phase noise ADPLL. An analog-to digital converter (ADC) may be used to improve the resolution of a TDC.

A digital PLL architecture may take the form of a typical ΔΣ fractional-N PLL which converts both positive and negative phase errors. A flip-flop may detect a phase error polarity based on the relative timing of "up" and "down" rising edges. A two-input XOR-gate may generate a pulse with duration representing a magnitude of the phase error. The ability to measure both positive and negative phase errors reduces a lock time. A digital PLL may be implemented in a 14 nanometer (nm) fin field effect transistor (FINFET) complementary metal oxide semiconductor (CMOS) process, and may be incorporated into a cellular radio frequency integrated circuit (RFIC).

SUMMARY

According to one embodiment, an apparatus includes a counter array; a ring oscillator that is electrically coupled to the counter array, where the counter array counts a number of cycles in the ring oscillator; an ADC driver that is electrically coupled to the ring oscillator; and an ADC that is electrically coupled to the ADC driver, where an output of the ADC is electrically coupled to the ring oscillator.

According to one embodiment, a method includes counting, by a counter array, a number of cycles in a ring oscillator having a plurality of stages; suspending the ring oscillator after a desired number of cycles in the ring oscillator to hold the voltage at an output of the ring oscillator; setting, by an analog-to-digital converter (ADC) driver, a desired common-mode control value based on the held voltage; setting, by the ADC driver, a desired gain control value based on the held voltage; adjusting, by an ADC, a common-mode control value until the ADC sends a ready signal; adjusting, by the ADC, a gain control value until ADC data from the ADC is not clipped; and storing the adjusted common-mode control value and the adjusted gain control value.

According to one embodiment, a method of manufacturing an apparatus. The method includes forming the apparatus on a wafer or a package with at least one other apparatus, wherein the apparatus includes a counter array; a ring oscillator that is electrically coupled to the counter array, where the counter array counts a number of cycles in the ring oscillator; an ADC driver that is electrically coupled to the ring oscillator; and an ADC that is electrically coupled to the ADC driver, where an output of the ADC is electrically coupled to the ring oscillator; and testing the apparatus, wherein testing the apparatus comprises testing the apparatus using one or more electrical to optical converters, one or more optical splitters that split an optical signal into two or more optical signals, and one or more optical to electrical converters.

According to one embodiment, a method of constructing an integrated circuit includes generating a mask layout for a set of features for a layer of the integrated circuit, wherein the mask layout includes standard cell library macros for one or more circuit features that include an apparatus including a counter array; a ring oscillator that is electrically coupled to the counter array, where the counter array counts a number of cycles in the ring oscillator; an ADC driver that is electrically coupled to the ring oscillator; and an ADC that is electrically coupled to the ADC driver, where an output of the ADC is electrically coupled to the ring oscillator; disregarding relative positions of the macros for compliance to layout design rules during the generation of the mask layout; checking the relative positions of the macros for compliance to layout design rules after generating the mask layout; upon detection of noncompliance with the layout design rules by any of the macros, modifying the mask layout by modifying each of the noncompliant macros to comply with the layout design rules; generating a mask according to the modified mask layout with the set of features for the layer of the integrated circuit; and manufacturing the integrated circuit layer according to the mask.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
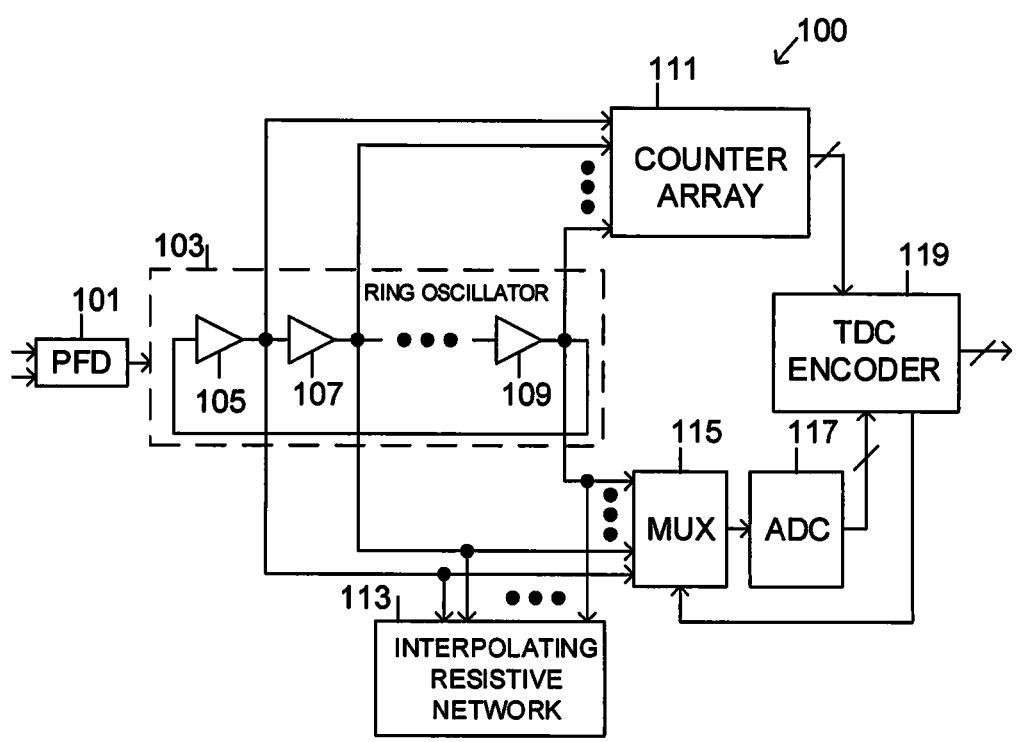
FIG. 1 illustrates an exemplary block diagram of an analog-to-digital-converter (ADC) assisted TDC, according to one embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

Several ADC architectures may be used in an ADC-assisted TDC. A flash ADC achieves high speed but requires many comparators that increase the power consumption of the TDC. A pipelined ADC requires several operational amplifiers that increase the power consumption of the TDC significantly. A successive approximation register (SAR) ADC exhibits low power consumption. However, an SAR ADC is limited by its settling time, which is the time required to charge a capacitive digital-to-analog converter (DAC). To improve the settling time, top-plate sampling may be used, because it may reduce the number of unit capacitors in the capacitive DAC by half as compared to the case where bottom-plate sampling is used.

Unfortunately, top-plate sampling increases the effect of a parasitic capacitance, which causing an SAR ADC to suffer from clipping due to gain and full scale errors. In addition, when top-plate sampling is used, a common-mode in the capacitive DAC is determined by the common-mode of the input signals to the ADC. If the common-mode of the input signals changes, the speed of a comparator may change and, thus, affect the conversion time of the SAR ADC. With process, voltage, and temperature (PVT) variations, the issues associated with ADC clipping and conversion time may worsen. The present disclosure describes an apparatus for and method of calibrating an amplitude and a common-mode of input signals to an ADC in a TDC to reduce the ADC conversion time and non-linearity due to ADC clipping in the TDC.

FIG. 1 illustrates an exemplary block diagram of an ADC-assisted TDC, according to one embodiment.

Referring to FIG. 1, a ADC-assisted TDC 100 includes a phase/frequency detector (PFD) 101, a ring oscillator 103, a counter array 111, an interpolating resistive network 113, a multiplexer 115, an ADC 117, and a TDC encoder 119. The ADC-assisted TDC 100 is divided into two main sections, the ring oscillator 103 and the ADC 117.

The PFD 101 includes a first input for receiving a reference clock signal (Ref Clk), a second input for receiving a feedback clock signal (Fb Clk), and an output. The output of the PFD 101 is an enable signal for the ring oscillator 103.

The ring oscillator 103 includes an input connected to the output of the PFD 101, a plurality of serially connected buffers 105, 107, and 109, and a plurality of outputs corresponding to the outputs of the buffers 105, 107, and 109. The output of the last buffer 109 is connected to the input of the first buffer 105. It is understood that the ring oscillator 103 may include any number of buffers without deviating from the scope of the present disclosure. The ring oscillator 103 is switched on for a period of time that is proportional to a time error between the Ref Clk signal and the Fb Clk signal, which are received as inputs to the PFD 101.

The counter array 111 includes inputs for receiving the outputs of the ring oscillator 103, and an output bus. The counter array 111 is used to calculate an integer number of cycles of the ring oscillator 103 while the ring oscillator 103 is turned on, and provide a coarse time-to-digital conversion.

The interpolating resistive network 113 includes a plurality of inputs connected to the outputs of the ring oscillator 103, respectively. A fractional portion of the cycles of the ring oscillator 103 is linearized by the interpolating resistive network 113 and converted to a voltage for fine time-to-digital conversion using the ADC 117.

The multiplexer 115 includes a plurality of inputs connected to corresponding outputs of the ring oscillator 103, respectively, a second input connected to the TDC encoder 119, and an output. The ADC 117 includes an input connected to the output of the multiplexer 115, and an output bus.

The TDC encoder 119 includes a first input bus connected to the output bus of the counter array 111, a second input bus connected to the output bus of the ADC 117, a first output connected to the second input of the multiplexer 115, and an output bus. The output of the TDC 100 is a combination of the coarse and fine time-to-digital conversions.

Figure 2:
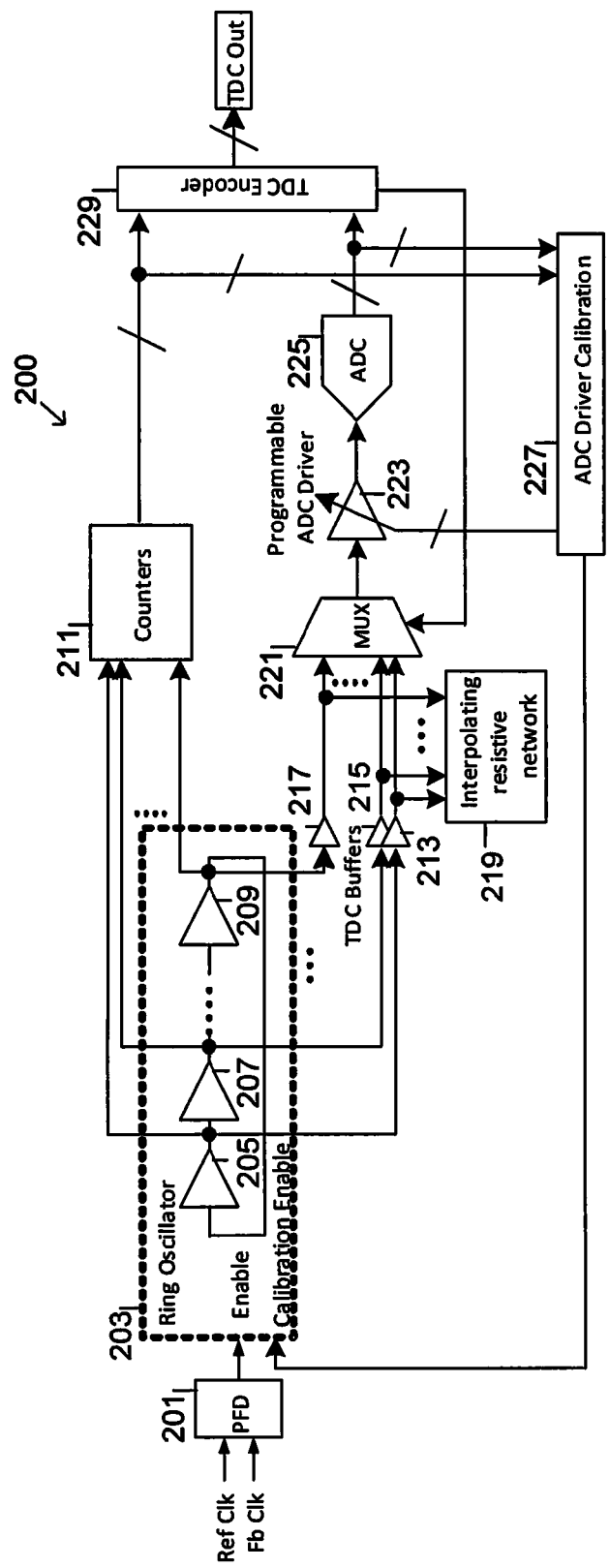
FIG. 2 illustrates an exemplary block diagram of an ADC-assisted TDC with one-time and online calibration, according to one embodiment.

FIG. 2 illustrates an exemplary block diagram of an ADC-assisted TDC with one-time and online calibration, according to one embodiment.

Referring to FIG. 2, a ADC-assisted TDC 200 includes a phase/frequency detector (PFD) 201, a ring oscillator 203, counters, or a counter array, 211, a plurality of TDC buffers 213, 215, and 217, an interpolating resistive network 219, a multiplexer 221, a programmable ADC driver 223, an ADC 225, an ADC driver calibrator 227, and a TDC encoder 229.

The PFD 201 includes a first input for receiving a Ref Clk signal, a second input for receiving an Fb Clk signal, and an output. The output of the PFD 201 is an enable signal for the ring oscillator 203.

The ring oscillator 203 includes a first input connected to the output of the PFD 201, a second input connected to the output of the ADC driver calibrator 227, a plurality of serially connected buffers 205, 207, and 209, and a plurality of outputs corresponding to the outputs of the buffers 205, 207, and 209. The output of the last buffer 209 is connected to the input of the first buffer 205. It is understood that the ring oscillator 203 may include any number of buffers without deviating from the scope of the present disclosure. The ring oscillator 203 is switched on for a period of time that is proportional to a time error between the Ref Clk signal and the Fb Clk signal, which are received as inputs to the PFD 201.

The counter array 211 includes inputs for receiving the outputs of the ring oscillator 203, and an output bus. The counter array 211 is used to calculate an integer number of cycles of the ring oscillator 203 while the ring oscillator 203 is turned on, and provide a coarse time-to-digital conversion.

The TDC buffers 213, 215, and 217 each include an input connected to a corresponding output of the ring oscillator 203, and an output. The TDC buffers 213, 215, and 217 may provide programmable gain. However, the TDC buffers 213, 215, and 217 may also provide unity-gain or any fixed gain.

The interpolating resistive network 219 includes a plurality of inputs connected to corresponding outputs of the TDC buffers 213, 215, and 217, respectively. A fractional portion of the cycles of the ring oscillator 203 is linearized by the interpolating resistive network 219 and converted to a voltage for fine time-to-digital conversion using the ADC 225.

The multiplexer 221 includes a plurality of inputs connected to corresponding outputs of the TDC buffers 213, 215, and 217, respectively, a second input connected to the TDC encoder 229, and an output. The programmable ADC driver 223 includes a first input connected to the output of the multiplexer 221, a second input connected to an output bus of the ADC driver calibrator 227, and an output.

The TDC buffers 213, 215, and 217 and the programmable ADC driver 223 are used to calibrate an amplitude and a common-mode of input signals to the ADC 225. The TDC buffers 213, 215, and 217 provide isolation from the ADC 225 kickback noise to the ring oscillator 203. In addition, the TDC buffers 213, 215, and 217 are used to drive the interpolating resistive network 219 and the programmable ADC driver 223. The programmable ADC driver 223 provides both programmable amplitude and common-mode inputs to the ADC 225. The programmable ADC driver 223 optimizes the input signal to the ADC 225 to avoid ADC 225 clipping and reduce ADC 225 conversion time across PVT.

The ADC 225 includes an input connected to the output of the programmable ADC driver 223, and an output bus.

The ADC driver calibrator 227 includes a first input bus connected to the output bus of the counter array 211, a second input bus connected to the output bus of the ADC 225, an output connected to the second input of the ring oscillator 201, and an output bus connected to the programmable ADC driver 223.

Figure 3:
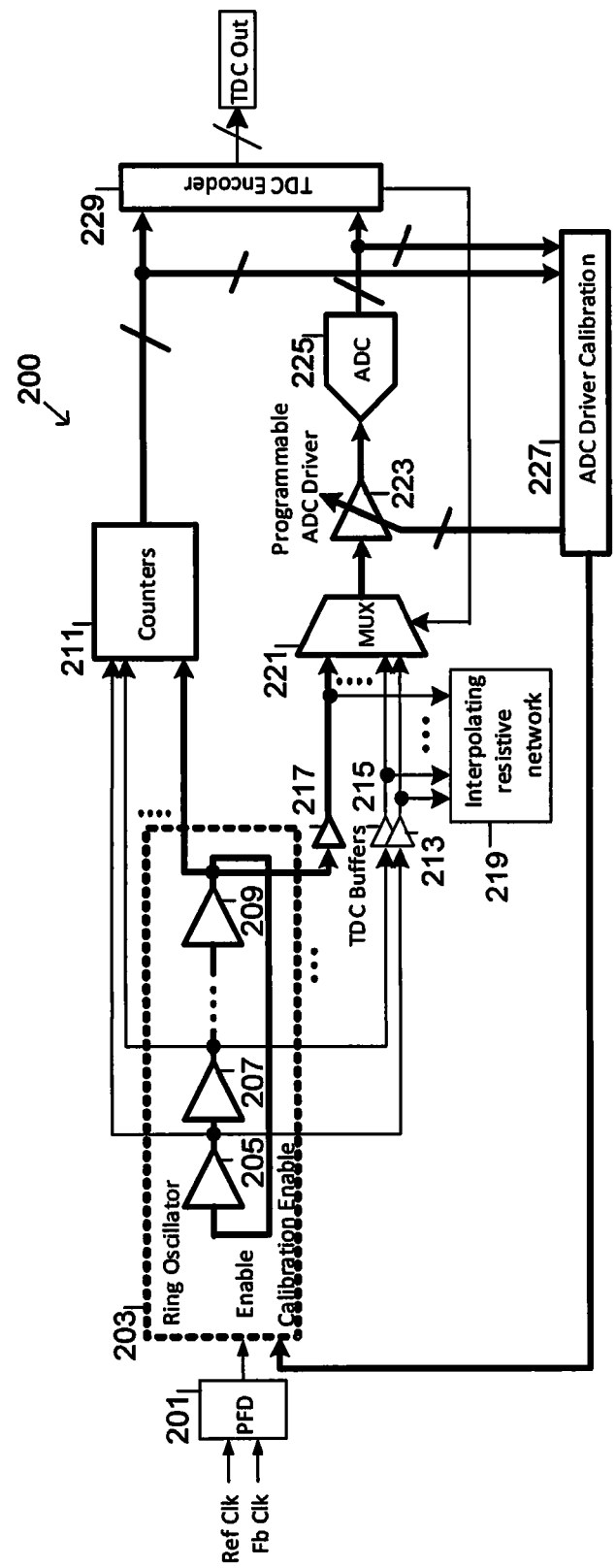
FIG. 3 illustrates an exemplary block diagram of the ADC-assisted TDC with one-time and online calibration of FIG. 2 with one active path, according to one embodiment.

FIG. 3 illustrates an exemplary block diagram of the ADC-assisted TDC with one-time and online calibration of FIG. 1 with one active path, according to one embodiment.

Referring to FIG. 3, during one-time calibration, only one active path, as indicated by heavy lines, is used. In FIG. 3, the active path has the output of the buffer 209 driving the TDC buffer 217. In another example, an active path having the output of the buffer 207 driving the TDC buffer 215 is used. In another example, an active path having the output path of the buffer 205 driving the TDC buffer 213 is used. The output (e.g., a calibration enable signal) of the ADC driver calibrator 227 is used to turn on the ring oscillator 203. Then, the counter array 211 starts to count the number of cycles in the ring oscillator 203. After a desired number of cycles (x cycles) of the ring oscillator 203, the counter array causes the calibration enable signal to suspend the ring oscillator 203 and hold the output of the buffer in the ring oscillator 203 at the highest voltage of the ring oscillator 203, where the buffer is in the active path. The x cycles may be a predetermined or programmable integer number of cycles in the ring oscillator 203 and may be predetermined or determined in real-time. This indicates that the input to the ADC 225 is also at its highest voltage. Then, the programmable ADC driver 223 is calibrated with the input voltage of the ADC 225. The gain of the ADC driver may be increased to a level where the output of the ADC driver is not clipped. During calibration, the ADC 225 may provide an ADC ready (ADC_RDY) signal that indicates when the ADC 225 completes an analog-to-digital conversion. For example, the ADC_RDY signal goes from low to high. In another example, the ADC_RDY signal goes from high to low.

The common-mode control value may be assigned according to a type of comparator design in the ADC 225. According to one embodiment, the common-mode control value is set to a maximum value and decreased if a comparator in the ADC 225 has a p-channel metal oxide semiconductor (PMOS) input pair, so the comparator speed increases as the common-mode value decreases. However, if the comparator speed decreases as the common-mode decreases, the common-mode control m may be set to 0 instead and may be incremented until the ADC_RDY signal is provided by the ADC 225. According to another embodiment, the common-mode control value is set to a minimum value and increased if the comparator in the ADC 225 has a n-channel metal oxide semiconductor (NMOS) input pair, so the comparator speed increases as the common-mode increases.

The TDC encoder 229 includes a first input bus connected to the output bus of the counter array 211, a second input bus connected to the output bus of the ADC 225, a first output connected to the second input of the multiplexer 221, and an output bus. The output of the TDC 200 is a combination of the coarse and fine time-to-digital conversions.

For online calibration, the calibration enable signal may not be used since it may affect the functionality of the ring oscillator 203. During online calibration, the ADC_RDY and ADC data which are provided to the TDC encoder 229 are also provided to the ADC driver calibrator 227. The ADC driver calibrator 227 performs fine adjustment to the common-mode control value and the gain control value.

Figure 4:
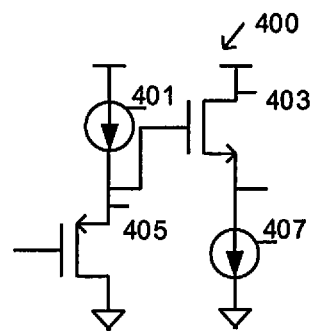
FIG. 4 illustrates an exemplary schematic diagram of a TDC buffer, according to one embodiment.

FIG. 4 illustrates an exemplary schematic diagram of a TDC buffer, according to one embodiment.

Referring to FIG. 4, a TDC buffer 400 includes a first current source 401, an n-channel metal oxide semiconductor field effect transistor (NMOSFET) 403, a p-channel metal-oxide semiconductor field effect transistor (PMOSFET) 405, and a second current source 407. The TDC buffer 400 may be similar to the TDC buffer 213, 215, or 217, according to one embodiment. However, the present disclosure is not limited thereto, and any other suitable buffer may be used in the present disclosure.

The first current source 401 includes a first terminal connected to a power supply voltage and a second terminal. The NMOSFET 403 includes a drain connected to the power supply voltage, a gate connected to the second terminal of the first current source 401, and a source. The PMOSFET 405 includes a drain connected to a ground potential, a gate for receiving an input to the TDC buffer 300, and a source connected to the second terminal of the first current source 401 and the gate of the NMOSFET 403. The second current source 407 includes a first terminal connected to the ground potential and a second terminal connected to the source of the NMOSFET 403, where the second terminal of the second current source 407 is the output of the TDC buffer 400.

According to one embodiment, the TDC buffer 400 of FIG. 4 with two source-followers is used as the TDC buffer 213, 215, or 217. The output of the first source-follower (e.g., the source of the first PMOSFET 405) is level-shifted to a higher voltage level and it may cause a stress issue for subsequent stages. A second source-follower (e.g., the source of the second NMOSFET 403) is used to level-shift the signal down to an acceptable voltage level. The TDC buffer 213, 215, or 217 may also be a unity-gain buffer or a programmable-gain buffer including one or more operational amplifiers.

Figure 5:
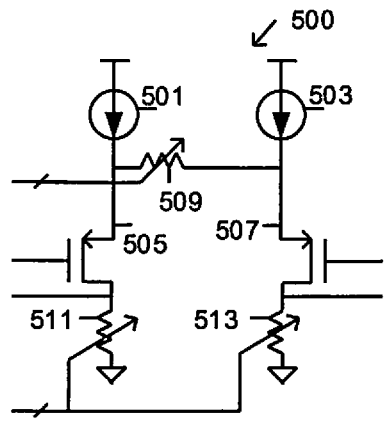
FIG. 5 illustrates an exemplary schematic diagram of a programmable ADC driver, according to one embodiment.

FIG. 5 illustrates an exemplary schematic diagram of a programmable ADC driver, according to one embodiment.

Referring to FIG. 5, a programmable ADC driver 500 includes a first current source 501, a second current source 503, a first PMOSFET transistor 505, a second PMOSFET transistor 507, a first variable resistor 509, a second variable resistor 511, and a third variable resistor 513. However, the present disclosure is not limited thereto, and any other suitable programmable ADC driver may be used in the present disclosure.

The first current source 501 includes a first terminal connected to a power supply voltage and a second terminal. The second current source 503 includes a first terminal connected to the power supply voltage and second terminal. The first PMOSFET 505 includes a source connected to the second terminal of the first current source 501, a gate for receiving a positive input, and a drain, which is a negative output of the programmable ADC driver 500. The second PMOSFET 507 includes a source connected to the second terminal of the second current source 503, a gate for receiving a negative input, and a drain, which is a positive output of the programmable ADC driver 500. The first variable resistor 509 includes a first terminal connected to the second terminal of the first current source 501, a second terminal connected to the second terminal of the second current source 503, and a control input for receiving a value n for gain control. The second variable resistor 511 includes a first terminal connected to the drain of the first PMOSFET 505, a second terminal connected to a ground potential, and a control input for receiving a value m for common-mode control. The third variable resistor 513 includes a first terminal connected to the drain of the second PMOSFET 507, a second terminal connected to the ground potential, and a control input for receiving m for common-mode control.

The programmable ADC driver 500 uses a PMOS differential pair (e.g., the third PMOSFET 505 and the fourth PMOSFET 507) with resistive loads. The resistive loads (e.g., the second variable resistor 511 and the third variable resistor 513, respectively) are programmable to provide programmable common-mode and gain. The variable resistor (e.g., the first variable resistor 509) at the source of the PMOS input pair provides programmable gain. The steps of the first, second and third variable resistors 509, 511, and 513 may be continuous or discrete. The common-mode and gain of the programmable ADC driver 223 may be controlled using digital bits, so the programmable steps may be discrete. The common-mode control value is controlled by j bits and the gain control value is controlled by k bits. The PMOS type ADC driver 500 drives a PMOS type comparator.

Figure 6:
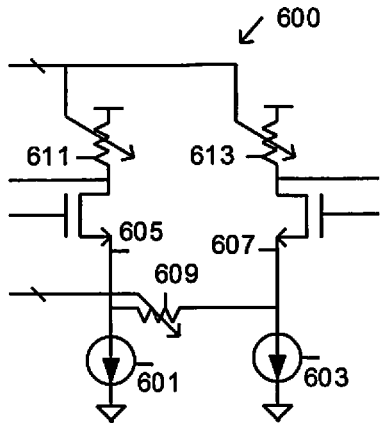
FIG. 6 illustrates an exemplary schematic diagram of a programmable ADC driver, according to one embodiment.

FIG. 6 illustrates an exemplary schematic diagram of a programmable ADC driver, according to one embodiment.

Referring to FIG. 6, a programmable ADC driver 600 includes a first current source 601, a second current source 603, a first NMOSFET transistor 605, a second NMOSFET transistor 607, a first variable resistor 609, a second variable resistor 611, and a third variable resistor 613. However, the present disclosure is not limited thereto, and any other suitable programmable ADC driver may be used in the present disclosure.

The first current source 601 includes a first terminal connected to a ground potential and a second terminal. The second current source 603 includes a first terminal connected to the ground potential and a second terminal. The first NMOSFET 605 includes a source connected to the second terminal of the first current source 601, a gate for receiving a positive input, and a drain, which is a negative output of the programmable ADC driver 600. The second NMOSFET 607 includes a source connected to the second terminal of the second current source 603, a gate for receiving a negative input, and a drain, which is a positive output of the programmable ADC driver 600. The first variable resistor 609 includes a first terminal connected to the second terminal of the first current source 601, a second terminal connected to the second terminal of the second current source 603, and a control input for receiving a value n for gain control. The second variable resistor 611 includes a first terminal connected to the drain of the first NMOSFET 605, a second terminal connected to a power supply voltage, and a control input for receiving a value m for common-mode control. The third variable resistor 613 includes a first terminal connected to the drain of the second NMOSFET 607, a second terminal connected to the power supply voltage, and a control input for receiving m for common-mode control.

The programmable ADC driver 600 uses an NMOS differential pair (e.g., the first NMOSFET 605 and the second NMOSFET 607) with resistive loads. The resistive loads (e.g., the second variable resistor 611 and the third variable resistor 613, respectively) are programmable to provide programmable common-mode and gain. The variable resistor (e.g., the first variable resistor 609) at the source of the NMOS input pair provides programmable gain. The steps of the first, second and third variable resistors 609, 611, and 613 may be continuous or discrete. The common-mode and gain of the programmable ADC driver 223 may be controlled using digital bits, so the programmable steps may be discrete. The common-mode control value is controlled by j bits and the gain control value is controlled by k bits. The NMOS type ADC driver 600 drives an NMOS type comparator.

Figure 7:
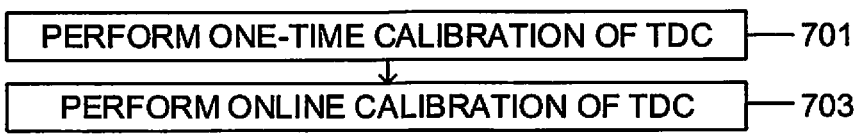
FIG. 7 illustrates an exemplary flowchart for performing one-time and online calibration of a TDC, according to one embodiment.

FIG. 7 illustrates an exemplary flowchart for performing one-time and online calibration of a TDC, according to one embodiment.

Referring to FIG. 7, at 701, the present system performs one-time calibration of the TDC. During one-time calibration, the present system performs coarse calibration before the TDC is operating.

At 703, the present system performs online calibration of the TDC. During online calibration, the present system performs fine calibration while the TDC is operating.

Figure 8:
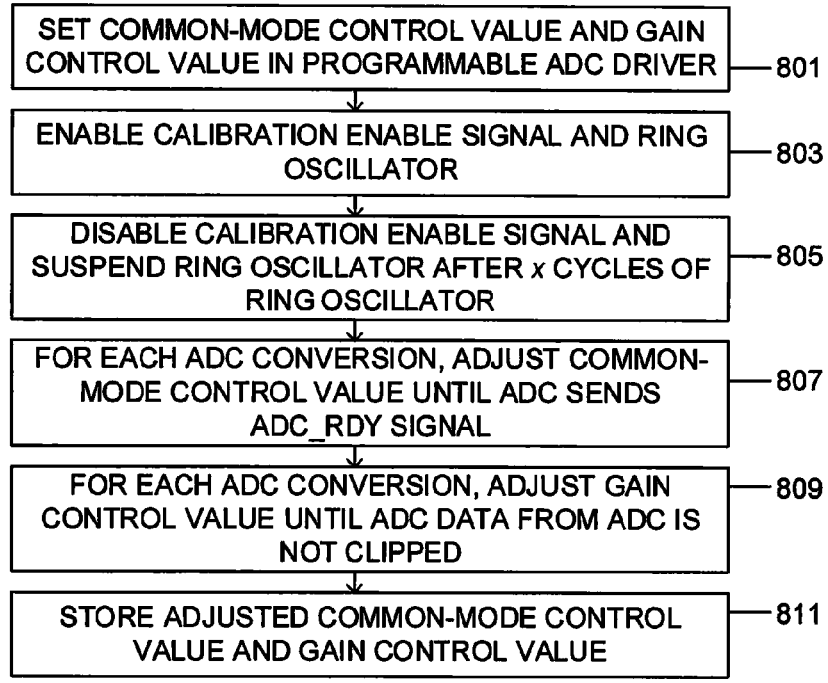
FIG. 8 illustrates an exemplary flowchart for performing one-time calibration of a TDC, according to one embodiment.

FIG. 8 illustrates an exemplary flowchart for performing one-time calibration of a TDC, according to one embodiment.

Referring to FIG. 8, at 801, a programmable ADC driver sets a maximum or minimum common-mode control value and a desired gain control value. The programmable ADC driver sets the common-mode control value at a minimum or maximum value based on the type of comparator design.

At 803, an ADC driver calibrator block provides an enable calibration signal to a ring oscillator to initiate operation of the ring oscillator.

At 805, after x cycles of the ring oscillator, a counter array provides a disable calibration signal to the ring oscillator to suspend the ring oscillator and hold an output of the ring oscillator at the highest voltage, where x is an integer.

At 807, an ADC changes the common-mode control value for each ADC conversion until the ADC provides an ADC_RDY signal.

At 809, the ADC changes the gain control value until ADC data from the ADC is not clipped.

At 811, the present system stores the calibrated values for the common-mode control value and the gain control value.

Figure 9:
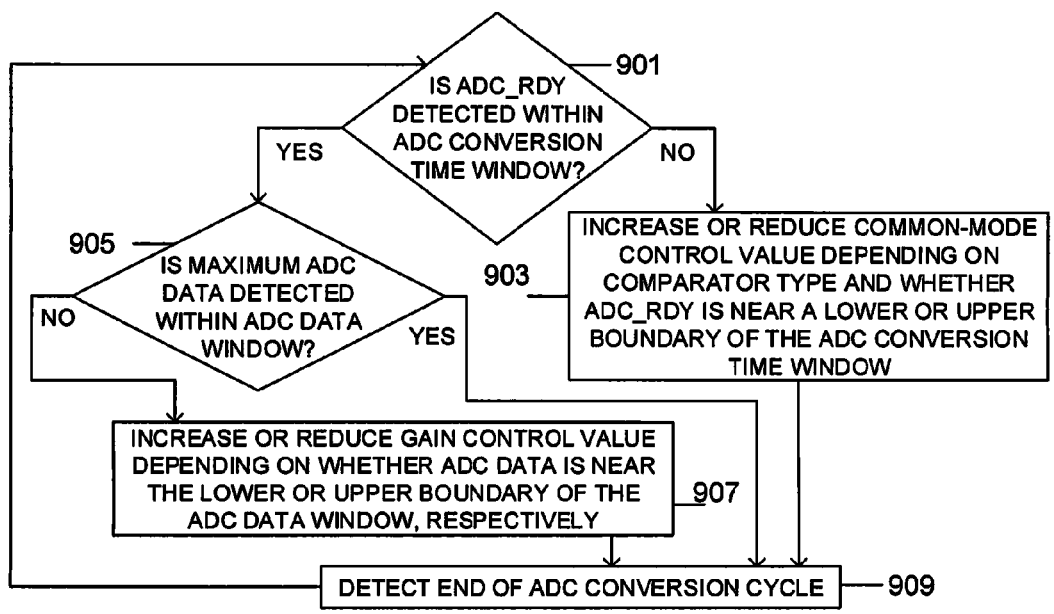
FIG. 9 illustrates an exemplary flowchart for performing calibration during each TDC conversion cycle, according to one embodiment.

FIG. 9 illustrates an exemplary flowchart for performing calibration during each TDC conversion cycle, according to one embodiment.

Referring to FIG. 9, at 901, the present system determines whether an ADC_RDY signal is detected within an ADC conversion time window.

At 903, if the ADC_RDY signal is not detected within the ADC conversion time window, i.e., the ADC_RDY signal is detected outside of the ADC conversion time window, the present system increases or decreases a common-mode control value depending on whether the comparator type is of an NMOS type or a PMOS type and whether the ADC_RDY signal is outside of a lower boundary or an upper boundary of the ADC conversion time window. For a comparator of PMOS type, if the ADC_RDY signal is outside and before a lower boundary of the ADC conversion time window, the present system increases the common-mode control value to move the ADC_RDY signal within the ADC conversion time window. If the ADC_RDY signal is outside and after an upper boundary of the ADC conversion time window, the present system decreases the common-mode control value to move the ADC_RDY signal within the ADC conversion time window. For a comparator of NMOS type, if the ADC_RDY signal is outside and before a lower boundary of the ADC conversion time window, the present system decreases the common-mode control value to move the ADC_RDY signal within the ADC conversion time window. If the ADC_RDY signal is outside and after an upper boundary of the ADC conversion time window, the present system increases the common-mode control value to move the ADC_RDY signal within the ADC conversion time window At 905, if the ADC_RDY signal is detected within the ADC conversion time window, the present system determines whether maximum ADC data is detected within an ADC data window.

At 907, if the ADC_RDY signal is detected within the ADC conversion time window and the maximum ADC data is not detected within the ADC data window, the present system increases or decreases a gain control value depending on whether the ADC data is near a lower or an upper boundary of the ADC data window respectively.

At 909, the present system detects an end of a TDC conversion cycle and repeats the process to 901.

Figure 10:
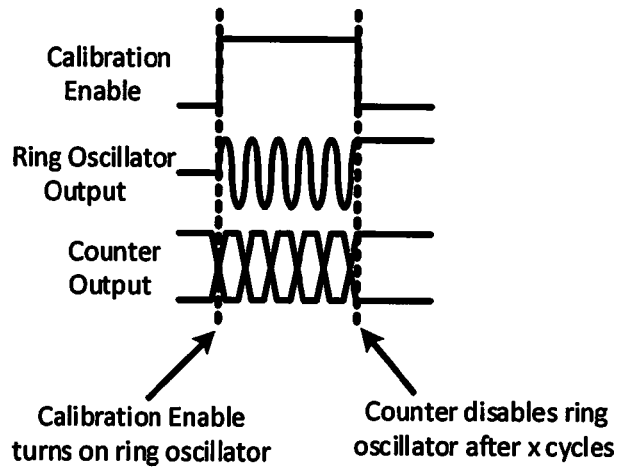
FIG. 10 illustrates exemplary waveforms for turning on and off a ring oscillator during one-time calibration, according to one embodiment.

FIG. 10 illustrates exemplary waveforms for turning on and off a ring oscillator during one-time calibration, according to one embodiment.

Referring to FIG. 10, a calibration enable signal goes from a logical 0 voltage to a logical 1 voltage, which turns on a ring oscillator. An output of the ring oscillator is shown as a cyclic signal. While the ring oscillator outputs a cyclic signal, a counter output signal shown counts the number of cycles of the ring oscillator. The ring oscillator operates while the calibration enable signal is a logical 1 and the counter has not counted x cycles of the ring oscillator. After x cycles of the ring oscillator are counted by the counter, the counter disables the ring oscillator.

Figure 11:
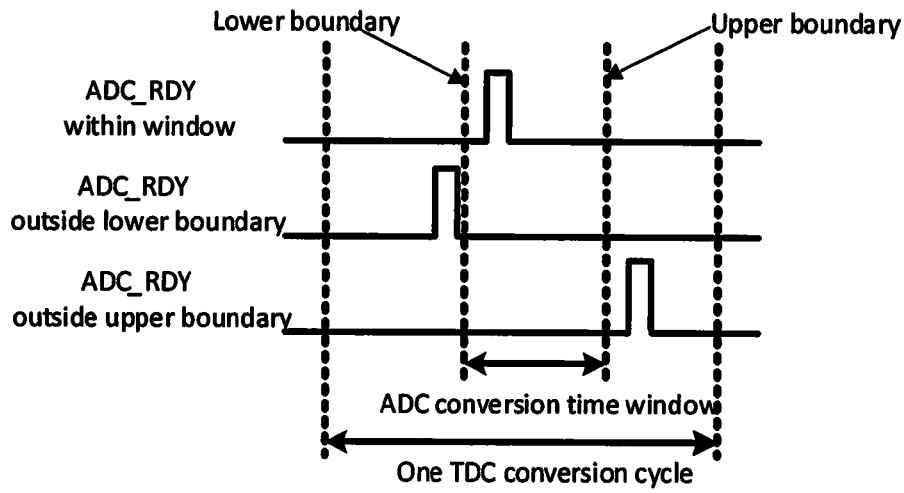
FIG. 11 illustrates exemplary waveforms of ADC_RDY signals during one TDC conversion cycle that are within, outside a lower boundary, and outside an upper boundary of an ADC conversion time window, according to one embodiment.

FIG. 11 illustrates exemplary waveforms of ADC_RDY signals during one TDC conversion cycle that are within, outside a lower boundary, and outside an upper boundary of an ADC conversion time window, according to one embodiment.

Referring to FIG. 11, one TDC conversion cycle is shown, where the one TDC conversion cycle includes an ADC conversion time window. Three types of ADC_RDY signals are shown, where one ADC_RDY signal is within the ADC conversion time window, one ADC_RDY signal is outside and before a lower boundary of the ADC conversion time window, and one ADC_RDY signal is outside and after an upper boundary of the ADC conversion time window. If the ADC_RDY signal is detected within the ADC conversion time window, then there is no change to a common-mode control value. However, if the ADC_RDY signal is outside of the ADC conversion time window, the present system increases or decreases the common-mode control value depending on whether a comparator type is of an NMOS type or a PMOS type.

If the comparator type is of a PMOS type, the comparator speed increases as the common-mode control value decreases. As the common-mode control value decreases, the ADC_RDY signal moves from outside the ADC conversion time window towards the lower boundary of the ADC conversion time window. As the common-mode control value increases, the ADC_RDY signal moves from outside the ADC conversion time window towards the upper boundary of the ADC conversion time window. If the ADC_RDY signal is outside and before the lower boundary of the ADC conversion time window, the present system increases the common-mode control value to move the ADC_RDY signal within the ADC conversion time window. If the ADC_RDY signal is outside and after the upper boundary of the ADC conversion time window, the present system decreases the common-mode control value to move the ADC_RDY signal within the ADC conversion time window.

If the comparator is of an NMOS type, the comparator speed increases as the common-mode control value increases. As the common-mode control value increases, the ADC_RDY signal moves from outside the ADC conversion time window towards the lower boundary of the ADC conversion time window. As the common-mode control value decreases, the ADC_RDY signal moves from outside the ADC conversion time window towards the upper boundary of the ADC conversion time window. If the ADC_RDY signal is outside and before the lower boundary of the ADC conversion time window, the present system decreases the common-mode control value to move the ADC_RDY signal within the ADC conversion time window. If the ADC_RDY signal is outside and after the upper boundary of the ADC conversion time window, the present system increases the common-mode control value to move the ADC_RDY signal within the ADC conversion time window.

Figure 12:
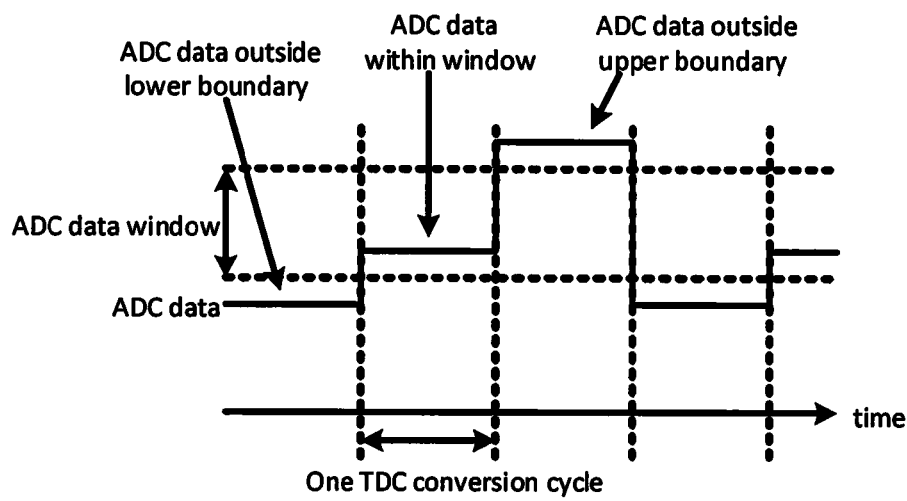
FIG. 12 illustrates exemplary waveforms of ADC data during TDC conversion cycles that are outside a lower boundary, within, and outside an upper boundary of an ADC data window, according to one embodiment.

FIG. 12 illustrates exemplary waveforms of ADC data during TDC conversion cycles that are outside a lower boundary, within, and outside an upper boundary of an ADC data window, according to one embodiment.

Referring to FIG. 12, three types of ADC data during associated TDC conversion cycles are shown, one where the ADC data is outside, or below, a lower boundary of an ADC data window, one where the ADC data is within the ADC data window, and one where the ADC data is outside, or above, an upper boundary of the ADC data window. If the ADC_RDY signal is detected within the ADC conversion time window and the maximum ADC data is not detected within the ADC data window, the present system increases or decreases a gain control value depending on whether the ADC data is near a lower or an upper boundary of the ADC data window respectively.

Figure 13:
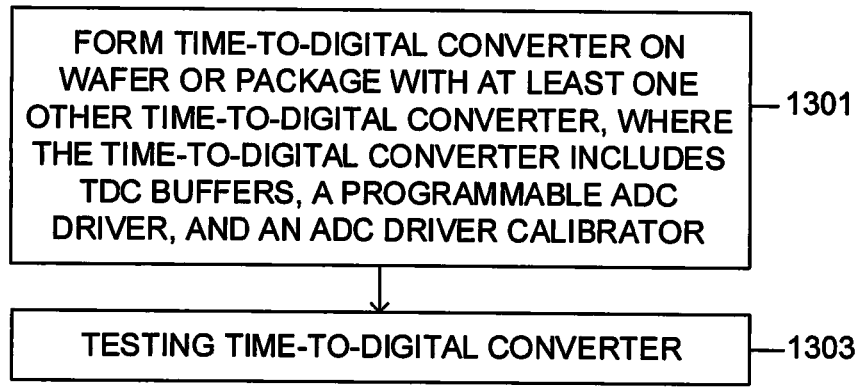
FIG. 13 illustrates an exemplary flowchart for manufacturing a TDC with one-time and online calibration, according to one embodiment.

FIG. 13 illustrates an exemplary flowchart for manufacturing a TDC with one-time and online calibration, according to one embodiment.

Referring to FIG. 13, a TDC is formed on a wafer or a package with at least one other TDC, where the TDC includes a plurality of TDC buffers, a programmable ADC driver, and an ADC driver calibrator at 1301.

At 1303, the TDC is tested. Testing the TDC may include testing the TDC using one or more electrical to optical converters, one or more optical splitters that split an optical signal into two or more optical signals, and one or more optical to electrical converters.

Figure 14:
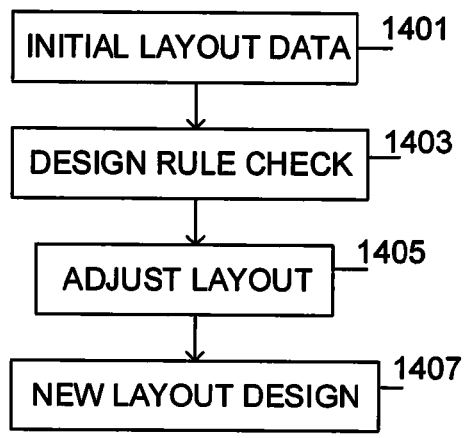
FIG. 14 illustrates an exemplary flowchart for constructing an integrated circuit, according to one embodiment.

FIG. 14 illustrates an exemplary flowchart for constructing an integrated circuit, according to one embodiment.

Referring to FIG. 14, initial layout data is constructed at 1401. For example, a mask layout is generated for a set of features for a layer of the integrated circuit, wherein the mask layout includes standard cell library macros for one or more circuit features that include a TDC that includes a plurality of TDC buffers, a programmable ADC driver, and an ADC driver calibrator, and disregarding relative positions of the macros for compliance to layout design rules during the generation of the mask layout.

At 1403, a design rule check is performed. For example, the method may check the relative positions of the macros for compliance to layout design rules after generating the mask layout.

At 1405, the layout is adjusted. For example, the method, upon detection of noncompliance with the layout design rules by any of the macros, may modify the mask layout by modifying each of the noncompliant macros to comply with the layout design rules.

At 1407, new layout data is generated. For example, the method may generate a mask according to the modified mask layout with the set of features for the layer of the integrated circuit. Then, the integrated circuit layer according to the mask may be manufactured.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
 a counter array;
 a ring oscillator that is electrically coupled to the counter array, where the counter array counts a number of cycles in the ring oscillator;
 an analog-to-digital converter (ADC) driver that is electrically coupled to the ring oscillator; and
 an ADC that is electrically coupled to the ADC driver, where an output of the ADC is electrically coupled to the ring oscillator.

2. The apparatus of claim 1, further comprising a phase/frequency detector (PFD) connected to the ring oscillator that includes a first input for receiving a reference clock signal, a second input for receiving a feedback clock signal, and an output for providing an enable signal.

3. The apparatus of claim 1, further comprising a plurality of time-to-digital-converter (TDC) buffers connected to the outputs of the ring oscillator.

4. The apparatus of claim 3, further comprising an interpolating resistive network connected to outputs of the plurality of TDC buffers.

5. The apparatus of claim 3, further comprising a multiplexer connected to the outputs of the TDC buffers.

6. The apparatus of claim 5, further comprising a programmable analog-to-digital converter (ADC) driver connected to an output of the multiplexer.

7. The apparatus of claim 1, wherein the ring oscillator includes a plurality of buffers connected in a ring, and wherein each of the outputs of the ring oscillator are connected to one of the plurality of buffers, respectively.

8. The apparatus of claim 1, further comprising a plurality of TDC buffers connected to the ring oscillator that each comprise:

an n-channel metal oxide semiconductor field effect transistor (NMOSFET);
a first current source;
a p-channel metal oxide semiconductor field effect transistor (PMOSFET); and
a second current source.

9. The apparatus of claim 1, wherein the programmable ADC driver is one of a unity-gain buffer or a programmable-gain buffer.

10. A method, comprising:
counting, by a counter array, a number of cycles in a ring oscillator having a plurality of stages;
suspending the ring oscillator after a desired number of cycles in the ring oscillator to hold the voltage at an output of the ring oscillator;
setting, by an analog-to-digital converter (ADC) driver, a desired common-mode control value based on the held voltage;
setting, by the ADC driver, a desired gain control value based on the held voltage;
adjusting, by an ADC, a common-mode control value until the ADC sends a ready signal;
adjusting, by the ADC, a gain control value until ADC data from the ADC is not clipped; and
storing the adjusted common-mode control value and the adjusted gain control value.

11. The method of claim 10, further comprising receiving, by a phase/frequency detector (PDF) a reference clock signal, a feedback clock signal, and outputting an enable signal.

12. The method of claim 10, wherein the ring oscillator includes a plurality of buffers connected in a ring, and wherein each of the outputs of the ring oscillator are connected to one of the plurality of buffers, respectively.

13. The method of claim 10, further comprising buffering the outputs of the ring oscillator by a plurality of buffers each comprising:
an n-channel metal oxide semiconductor field effect transistor (NMOSFET);
a first current source;
a p-channel metal oxide semiconductor field effect transistor (PMOSFET); and
a second current source.

14. The method of claim 10, further comprising:
determining if the ready signal is detected within an ADC conversion time window;
if the ready signal is not detected within the ADC conversion time window, either increasing or reducing the common-mode control value depending on a comparator type within the ADC and whether the ready signal is outside of a lower or an upper boundary of the ADC conversion time window;
if the ready signal is detected within the ADC conversion time window, determining if maximum ADC data is detected within an ADC data window; and
if the ready signal is detected within the ADC conversion time window and the maximum ADC data is not detected within the ADC data window, the gain control value is either increased or reduced depending on whether the ADC data is within a predetermined distance of a lower or an upper boundary of the ADC data window, respectively.

15. A method of manufacturing an apparatus, comprising:
forming the apparatus on a wafer or a package with at least one other apparatus, wherein the apparatus includes a counter array; a ring oscillator that is electrically coupled to the counter array, where the counter array counts a number of cycles in the ring oscillator; an analog-to-digital converter (ADC) driver that is electrically coupled to the ring oscillator; and an ADC that is electrically coupled to the ADC driver, where an output of the ADC is electrically coupled to the ring oscillator; and
testing the apparatus, wherein testing the apparatus comprises testing the apparatus using one or more electrical to optical converters, one or more optical splitters that split an optical signal into two or more optical signals, and one or more optical to electrical converters.

16. The method of claim 15, wherein the ring oscillator includes a plurality of buffers connected in a ring, and wherein each of the outputs of the ring oscillator are connected to one of the plurality of buffers, respectively.

17. The method of claim 15, wherein the apparatus further comprising a phase/frequency detector (PFD) connected to the ring oscillator that includes a first input for receiving a reference clock signal, a second input for receiving a feedback clock signal, and an output for providing an enable signal.

18. A method of constructing an integrated circuit, comprising:
generating a mask layout for a set of features for a layer of the integrated circuit, wherein the mask layout includes standard cell library macros for one or more circuit features that include an apparatus including a counter array; a ring oscillator that is electrically coupled to the counter array, where the counter array counts a number of cycles in the ring oscillator; an analog-to-digital converter (ADC) driver that is electrically coupled to the ring oscillator; and an ADC that is electrically coupled to the ADC driver, where an output of the ADC is electrically coupled to the ring oscillator;
disregarding relative positions of the macros for compliance to layout design rules during the generation of the mask layout;
checking the relative positions of the macros for compliance to layout design rules after generating the mask layout;
upon detection of noncompliance with the layout design rules by any of the macros, modifying the mask layout by modifying each of the noncompliant macros to comply with the layout design rules;
generating a mask according to the modified mask layout with the set of features for the layer of the integrated circuit; and
manufacturing the integrated circuit layer according to the mask.

19. The method of claim 18, wherein the ring oscillator includes a plurality of buffers connected in a ring, and wherein each of the outputs of the ring oscillator are connected to one of the plurality of buffers, respectively.

20. The method of claim 18, wherein the apparatus further comprising a phase/frequency detector (PFD) connected to the ring oscillator that includes a first input for receiving a reference clock signal, a second input for receiving a feedback clock signal, and an output for providing an enable signal.

* * * * *